United States Patent [19]

Shigekane

[11] Patent Number: 4,905,069
[45] Date of Patent: Feb. 27, 1990

[54] DARLINGTON TRANSISTOR ARRANGEMENT

[75] Inventor: Hisao Shigekane, Nagano, Japan

[73] Assignee: Fuji Electric Co., Ltd., Tokyo, Japan

[21] Appl. No.: 670,828

[22] Filed: Nov. 13, 1984

[30] Foreign Application Priority Data

Nov. 10, 1983 [JP] Japan ............................ 58-173957[U]

[51] Int. Cl.4 ..................... H01L 23/48; H01L 23/28;
H01L 23/16; H01L 27/02
[52] U.S. Cl. ......................................... 357/72; 357/68;
357/75; 357/46
[58] Field of Search ....................... 357/72, 46, 68, 76,
357/77, 75, 74, 81

[56] References Cited
U.S. PATENT DOCUMENTS 4,106,052 8/1978 Schierz .................................... 357/75
4,518,982 5/1985 Du Bois et al. ........................ 357/68

Primary Examiner—Rolf Hille
Assistant Examiner—Robert P. Limanek
Attorney, Agent, or Firm—Brumbaugh, Graves, Donohue & Raymond

[57] ABSTRACT

In the particular embodiment described in the specification, a Darlington transistor arrangement has a stepped upper surface with an emitter terminal of the preceding transistor disposed at the bottom of a groove formed between spaced raised portions on which the collector terminal and the emitter terminal of the transistor are located. A base terminal is disposed at a lower surface formed on the outside of the raised portion where either the collector terminal or the emitter terminal is situated, thereby providing sufficient insulation distance between terminals and avoiding the problem resulting from a crossing between the power wiring to the load or power source and the base driving wiring.

1 Claim, 2 Drawing Sheets

DARLINGTON TRANSISTOR ARRANGEMENT

BACKGROUND OF THE INVENTION

This invention relates to transistor circuits and, more particularly, to a new and improved Darlington transistor arrangement.

Heretofore, Darlington transistor arrangements have had certain disadvantages resulting from the necessity to provide long surface leakage paths between different sets of terminals. Where projecting ribs are provided to increase the length of the leakage path, the transistor cannot be mounted directly on a circuit board and where recesses are provided for that purpose the size of the transistor must be increased. Moreover, where a stepped arrangement has been provided, the interaction between high current and low current conductors at a crossing location causes signal distortions.

Accordingly, it is an object of this invention to provide a new and improved Darlington transistor arrangement which overcomes the above-mentioned disadvantages of the prior art.

Another object is to provide a Darlington transistor body wherein certain terminals are situated at an upper level stepped above the level for another terminal, but having no rib so as to permit direct mounting to a printed circuit board, while providing a sufficient insulation distance between the terminals without enlarging the outer configuration of the transistor body and avoiding any interaction between the wiring for the power terminals and the wiring for the base terminal when two transistors are wired in parallel.

BRIEF SUMMARY OF THE INVENTION

According to this invention, the foregoing objects can be attained by providing a Darlington transistor resin body having stepped surface and a collector terminal and an emitter terminal disposed at a higher level of the stepped surface, along with a base terminal and an emitter terminal of a preceding stage transistor situated at a lower level of the stepped surface. Moreover the surface on which the base terminal is located is disposed outside the collector and emitter terminal locations on the transistor body and the surface at which the emitter terminal of the preceeding transistor is situated is located between the surfaces at which the collector terminal and the emitter terminal are situated.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENTS

Figure 1:
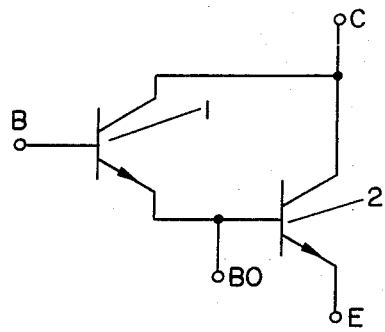
FIG. 1 is a schematic circuit diagram showing an equivalent circuit for a typical Darlington transistor arrangement.
Figure 2:
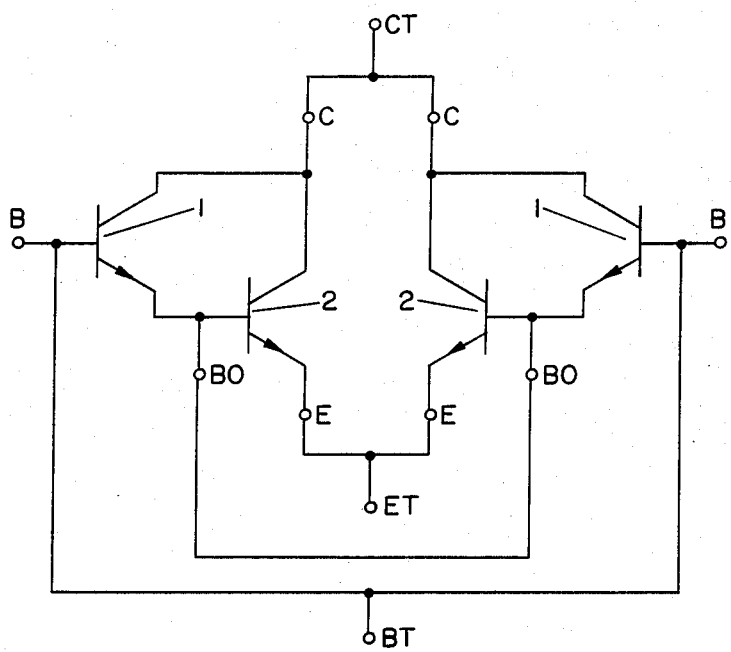
FIG. 2 is a schematic circuit diagram showing and equivalent circuit for a parallel-connected Darlington transistor arrangement.
Figure 3A:
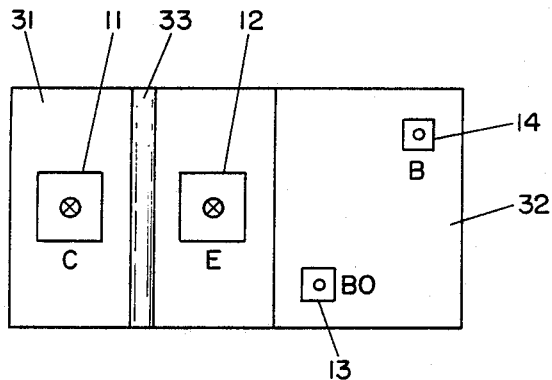
FIG. 3(a) is a plan view showing one arrangement for the external configuration of a conventional Darlington transistor.
Figure 3B:
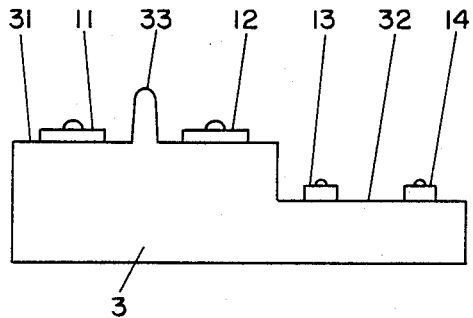
FIG. 3(b) is a front elevational view of the transistor shown in FIG. 3(a)

A Darlington transistor consists of two transistors 1 and 2 connected in the manner shown in the equivalent circuit illustrated in FIG. 1. In Darlngton transistor circuits two or more Darlington transistors are frequently connected together in a parallel configuration, in which the collector terminals C, the individual base terminals B and the emitter terminals E of the Darlington transistors of the parallel configuration are respectively connected together to form a common collector terminal CT, a common base terminal BT and a common emitter terminal ET as shown in FIG. 2. In addition, the emitters of the first stage transistors (i.e., transistor 1) in the Darlington transistors of the parallel configuration are often connected together, as shown in FIG. 2, in order to improve the imbalance in the collector current of the respective Darlington transistors of the parallel configuration. For the latter connection, an emitter-base terminal BO is provided in each Darlington transistor at the junction between the emitter of transistor 1 and the base of transistor 2 of the Darlington transistor.

Where these four terminals, B, C, E and BO, of a Darlington transistor are arranged on the upper surface of a Darlington transistor body which is joined at its lower surface to a heat sink body, an arrangement of the type shown in FIGS. 3(a) and 3(b) is provided. Specifically, in order to increase the surface leakage path between the collector terminal 11 and the emitter terminal 12 of one transistor, which are high current terminals, and the emitter-base terminal 13 and the base terminal 14, which are low current terminals, they are disposed on stepped upper surfaces 31 and 32 of the resin transistor body 3, respectively. Furthermore, in order to increase the surface leakage path between the collector and emitter terminals 11 and 12, a rib 33 is provided between them. However, this results in a disadvantage because the rib 33 constitutes an obstruction in the case where respective conductor of a printed circuit board are to be bonded directly on to the collector terminal 11 and the emitter terminal 12 at the uppermost surface 31 of the Darlington transistor body.

Figure 4:
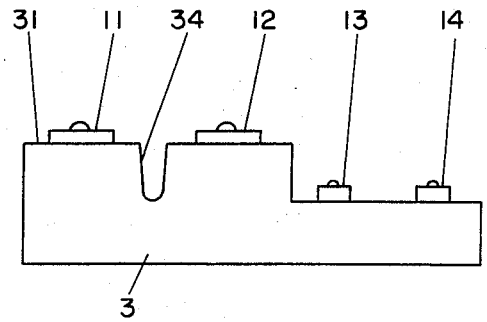
FIGS. 4 through 6 are front elevational views illustrating the external configuration of different conventional Darlington transistor bodies.
Figure 5:
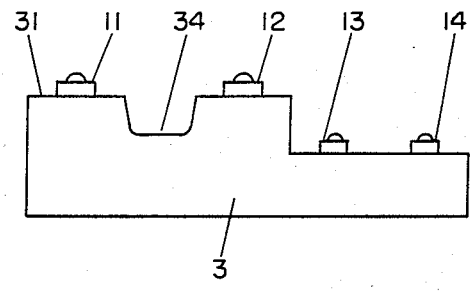

In order to eliminate the foregoing disadvantage, transistor arrangements have been formed with a groove 34 in the upper surface 31 of the body instead of the rib 33 between the collector terminal 11 an the emitter terminal 12, as shown in FIG. 4. Howevr, since a long enough surface leakage path cannot be obtained with that arrangement, the width of the groove 34 must be increased as shown in FIG. 5 to provide a longer surface leakage path. This is a disadvantage because the outer configuration of the transistor body must then be enlarged.

Figure 6:
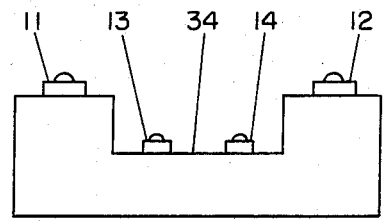
Figure 7:
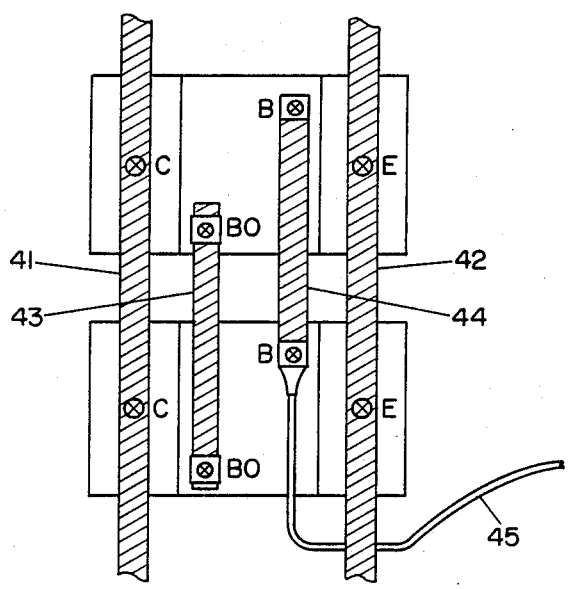
FIG. 7 is a plan view showing two Darlington transistors of the type illustrated in FIG. 6 in parallel connection.

In order to avoid this problem, an arrangement has been provided in which the BO terminal 13 and the B terminal 14 are arranged at the bottom surface of a groove 34 as shown in FIG. 6. With this structure, terminals of the same type in two Darlington transistos are connected by using bus bars 41-44 as shown in FIG. 7, and the C terminals and the E terminals are connected with a load or a power source by way of the bus bars 41 and 42 in order to provide the equivalent circuit as shown in FIG. 2. Using this arrangement, however, a lead wire 45 conecting a base driving circuit with the base terminal crosses one of the bus bars 41 and 42 through which high current flows from the power terminal, and the base lead wire 45, in which only a low current flows, suffers from an electromagnetic induction from the bus bar 41 or 42, disturbing the current waveform. Any attempt to avoid the problem of this interaction by wiring changes will make the wiring more complicated.

Figure 8:
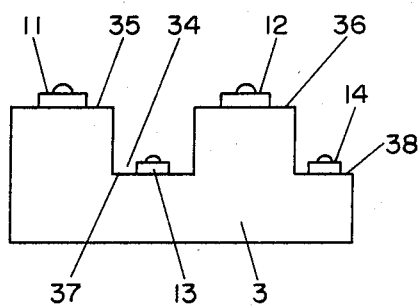
FIG. 8(a) is a front elevational view showing the outer configuration for a representative embodiment of a Darlington transistor according to the present invention.
FIG. 8(b) is a plan view of the embodiment shown in FIG. 8(a).
Figure 8:
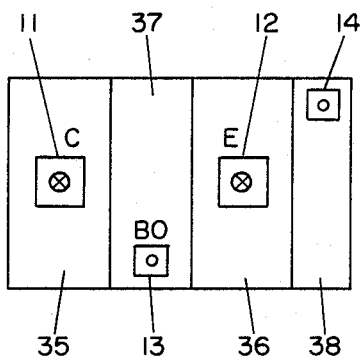

FIG. 8(a) and 8(b) show one embodiment according to the present invention in which the upper surface of a resin body 3 for a Darlington transistor has two upper surfaces 35 and 36 and two lower surfaces 37 and 38, the lower surface 37 being located between the upper surfaces 35 and 36 and the lower surface 38 being on the outer side of the upper surface 36. A collector terminal 11 and an emitter terminal 12 are disposed on the surfaces 35 and 36, respectively, and the emitter terminal 13 of a preceding stage and the base terminal 14 of the transistor are disposed on the lower surfaces 37 and 38, respectively.

When two or more Darlington transistors arranged according to the invention are connected in parallel, because the BO terminals 13 located on the lower surface 37 between the upper surfaces 35 and 36 are connected only with each other and not to any external circuit, there is no need to provide a conductor from them which crosses one of the bus bars connecting the C terminals 11 and the E terminals 12 to the terminals of a load or a power source. Further, since the B terminal 14 is located to the outside of the E terminal 12, there is no crossing between the base connection lead wire and the power wiring. In addition, a sufficient surface leakage path can be maintained between the C terminal 11 and the E terminal 12 along the groove 34 by disposing the BO terminal 13 at a position spaced from a line connecting the C and E terminals. As a result, the outer configuration of the body 3 need not be enlarged as compared with the arrangement shown in FIG. 4, which has a narrow groove 34.

If desired, the B terminal may be disposed to the outside of the C termial instead of to the outside of the E terminal as in the embodiment shown in FIGS. 8(a) and 8(b).

I claim:

1. A Darlington transistor including a resin housing body having a stepped surface comprising alternating upper and lower planar portions; a collector terminal and an emitter terminal formed on respective upper portions of the stepped surface; a base terminal and an emitter-base terminal formed on respective lower portions of the stepped surface, wherein the lower portion of the stepped surface on which the base terminal is formed is situated between an edge of the stepped surface and the upper portions thereof on which the collector and emitter terminals are respectively formed and the lower portion of the stepped surface on which the emitter-base terminal is formed is situated between the upper portions of the stepped surface on which the collector and emitter terminals are respectively formed.

* * * * *